United States Patent
Sonntag et al.

(10) Patent No.: US 10,348,283 B1
(45) Date of Patent: Jul. 9, 2019

(54) LOW POWER SWITCHED-CAPACITOR COMPARATOR

(71) Applicant: Silicon Laboratories Inc., Austin, TX (US)

(72) Inventors: Jeffrey L. Sonntag, Austin, TX (US); Svajda Miroslav, Prague (CZ); Dazhi Wei, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/902,798

(22) Filed: Feb. 22, 2018

(51) Int. Cl.
| | |
|---|---|
| H03K 5/24 | (2006.01) |
| H02M 1/00 | (2006.01) |
| G05F 1/46 | (2006.01) |
| H02M 3/155 | (2006.01) |

(52) U.S. Cl.
CPC ............ *H03K 5/24* (2013.01); *G05F 1/46* (2013.01); *H02M 3/155* (2013.01); *H02M 2001/0045* (2013.01)

(58) Field of Classification Search
CPC ............. H03K 5/24; G05F 1/46; H02M 3/155
USPC ......................................................... 327/77
See application file for complete search history.

(56) References Cited

U.S. PATENT DOCUMENTS

| | | | |
|---|---|---|---|
| 6,617,972 B2 | 9/2003 | Takarada | |
| 7,064,531 B1 | 6/2006 | Zinn | |
| 7,148,670 B2 | 12/2006 | Inn et al. | |
| 8,779,729 B2 | 7/2014 | Shiraishi | |
| 8,823,419 B1* | 9/2014 | O'Leary | H03K 5/22 327/205 |
| 9,557,354 B2 | 1/2017 | Chen et al. | |
| 2012/0098518 A1 | 4/2012 | Unagami | |
| 2012/0203484 A1 | 8/2012 | Ando et al. | |
| 2012/0229110 A1 | 9/2012 | Huang et al. | |
| 2014/0191741 A1 | 7/2014 | Nork | |
| 2017/0093271 A1 | 3/2017 | Lai et al. | |

OTHER PUBLICATIONS

Maji, S., et al., "Digital LDO with Time-Interleaved Comparators for Fast Response and Low Ripple," 2016 IEEE Computer Society Annual Symposium on VLSI, pp. 337-342.
U.S. Appl. No. 15/959,535, filed Apr. 23, 2018, entitled PFM Power Management System with Autonomous Mode Switching, Inventors Jeffrey L Sonntag et al.

* cited by examiner

*Primary Examiner* — Tomi Skibinski
(74) *Attorney, Agent, or Firm* — Zagorin Cave LLP

(57) ABSTRACT

A voltage converter includes a comparator that continuously monitors an output voltage of the voltage converter. The comparator includes a first comparator core utilizing first and second switched capacitors and a second comparator core using third and fourth switched capacitors. The first comparator core is powered down or in a refresh mode while the second comparator core is monitoring the output voltage. The second comparator core is powered down or in the refresh mode while the first comparator core is monitoring the output voltage. The first and second switched capacitors are configured in series with an amplifier stage of the first comparator core while the first comparator core is monitoring the output voltage. The refresh mode charges the first (third) and second (fourth) switched capacitors to a scaled version of the output voltage and a reference voltage less an offset voltage, respectively.

20 Claims, 7 Drawing Sheets

LOW POWER SWITCHED-CAPACITOR COMPARATOR

BACKGROUND

Field of the Invention

This disclosure relates to comparators and more particularly to low power switched capacitor comparators.

Description of the Related Art

Power converters convert a voltage from a voltage source such as a battery to a voltage used by electronic circuits. For example, a cell phone utilizes a voltage converter to convert the voltage supplied by the battery to a voltage utilized for circuits of the cell phone. Converting from one voltage to another utilizes power and achieving greater efficiency in voltage conversion is desirable to extend battery life.

SUMMARY OF EMBODIMENTS OF THE INVENTION

In an embodiment, a method includes monitoring an output voltage using a first comparator core and a second comparator core by operating the first and second comparator cores such that when the first comparator core is monitoring the output voltage, the second comparator core is powered off or the second comparator core is being refreshed. When the second comparator core is monitoring the output voltage the first comparator core is powered off or the second comparator core is being refreshed.

In another embodiment, a comparator includes a first comparator core and a second comparator core. Control logic maintains the first comparator core powered down or in a refresh mode to refresh the first comparator core while the second comparator core is monitoring the output voltage. The control logic being maintains the second comparator core powered down or in the refresh mode while the first comparator core is monitoring the output voltage.

In another embodiment, a voltage converter includes a comparator to continuously monitor an output voltage of the voltage converter. The comparator includes a first comparator core utilizing first and second switched capacitors and a second comparator core using third and fourth switched capacitors. The first comparator core is powered down or in a refresh mode to refresh the first comparator core while the second comparator core is monitoring the output voltage. The second comparator core is powered down or in the refresh mode to refresh the second comparator core while the first comparator core is monitoring the output voltage. The first and second switched capacitors are configured in series with an amplifier stage of the first comparator core while the first comparator core is monitoring the output voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
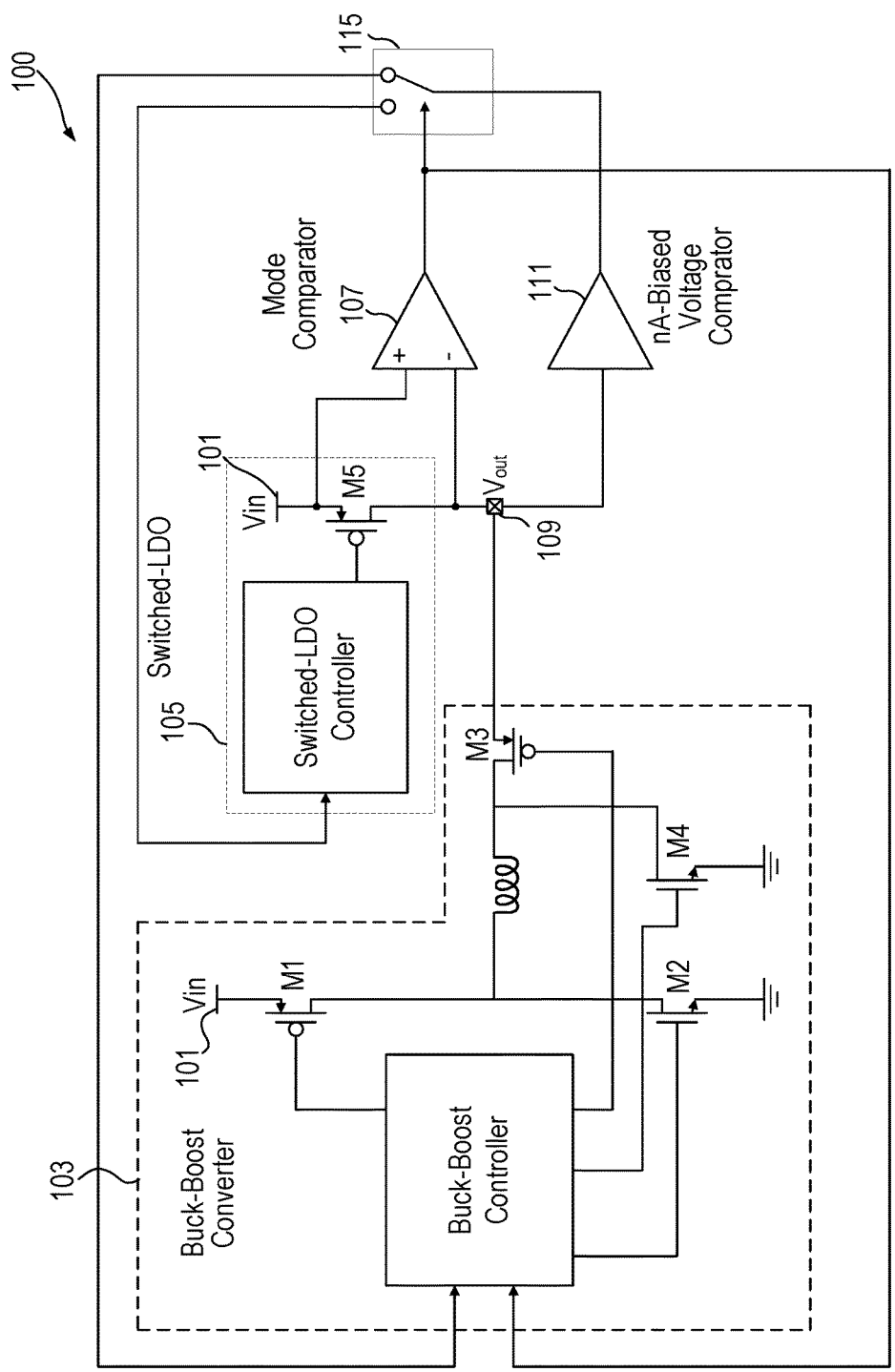
FIG. 1 illustrates an example of a voltage converter that utilizes a battery as a voltage source.

Voltage converters monitor the output voltage being generated and adjust the operation of the voltage converter to maintain the output voltage at the target voltage level. That requires a comparator to compare the output voltage with the target voltage and supply an indication of the comparison. FIG. 1 illustrates an example of a voltage converter 100 that utilizes a battery as a voltage source Vin 101. In an embodiment voltage converter 100 includes the buck-boost converter 103 that operates in buck mode, boost mode, or buck-boost mode. A low drop out (LDO) regulator 105 can also be utilized instead of the buck-boost converter 103. A mode comparator 107 compares the output voltage 109 to the input voltage 101 to determine the operational mode of the voltage converter. A voltage comparator 111 compares the output voltage Vout 109 to a threshold voltage corresponding to the target voltage and asserts a feedback signal each time the output voltage falls below its target voltage. Selector circuit 115 selects the destination for the output of the voltage comparator to be either the buck-boost converter 103 or the LDO regulator 105 based on the output of the mode comparator 107.

In boost mode transistor M1 is on, transistor M2 is off and transistors M3 and M4 switch in accordance with standard boost operation. In buck mode, M3 is on, M4 is off, and M1 and M2 switch in accordance with standard buck operation. In buck-boost mode, the four switches are used in this order: M1 and M4 are on; M1 and M3 are on; then M2 and M3 are on. In switched-LDO operation, only switch M5 is used. Each time the LDO receives a feedback signal from the voltage comparator indicating the output voltage is below the output target voltage, LDO controller 105 outputs a single pulse of fixed width and fixed current magnitude. That results in the LDO supplying a known, fixed charge to the output with each pulse, enabling accurate Coulomb counting.

The mode comparator 107 compares Vin and Vout at the end of each buck-boost or LDO pulse. The mode comparator compares the difference between Vin and Vout to a programmed threshold to determine in which mode the system should operate. A built-in hysteresis may be used to avoid continually switching modes near the threshold. The mode comparator only needs to make one comparison for each current pulse, and therefore has a negligible effect on the system efficiency, including at light-load. The mode comparator is disabled between Buck-Boost or LDO pulses to save power.

The mode of operation can be dynamically changed as the input and/or output voltages change. In most practical battery-operated systems, the battery voltage will change over time. The Buck-Boost and Switched-LDO are both designed to work in the same Pulse-Frequency Modulation (PFM)

feedback loop with the voltage comparator to allow seamless transitions between modes.

Coulomb counting is also maintained across modes since both the Buck-Boost converter and the Switched-LDO produce a fixed charge per pulse. A traditional, non-switched LDO would not have this ability.

Figure 2:
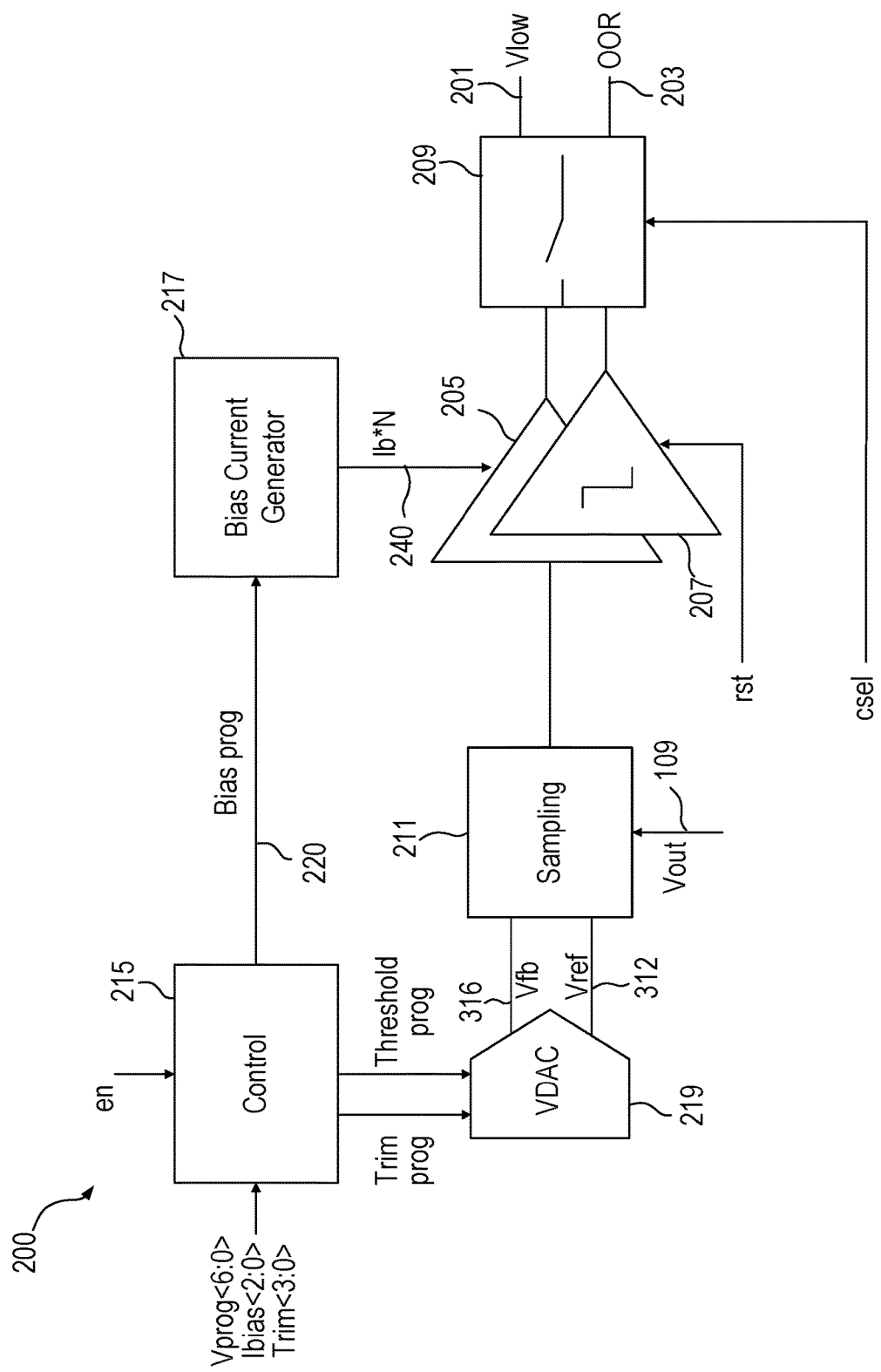
FIG. 2 illustrates a voltage comparator according to an embodiment.

Referring to FIG. 2, an embodiment 200 of the voltage comparator 111 is shown in more detail. The comparator 200 always runs and monitors the output 109 of the voltage converter. The comparator is designed to reduce the impact on efficiency by efficiently comparing the output voltage to a target threshold as explained further herein. The comparator 200 outputs a low voltage indication (Vlow) 201 to indicate the output voltage is below the programmed target voltage. In an embodiment, the voltage comparator also outputs an out of range (OOR) detection 203 when the output voltage is farther out of range indicating additional loop regulation may be required. The comparator 200 includes two independently switched-capacitor comparator cores 205 and 207, which are used in a ping-pong configuration. The switch 209 selects the output from the active core output. When one of the cores is active, the other core is either being refreshed, as explained further herein, or powered down. The ping pong use of the cores provides continuous monitoring. Continuous monitoring provides more accurate control of the output voltage. The continuous monitoring described herein provides the advantage of continuous monitoring while providing power efficiency as the switched capacitor comparators utilize low power with no permanent DC feedback between the comparator input and output.

Before becoming active again, the non-active core is powered up and refreshed. During refresh the switched capacitors in the sampling circuit 211 of the non-active core are charged to desired voltage levels and only after that the non-active core becomes the active core. The formerly active core gets powered down until the next refresh cycle. The control circuit 215 adjusts the bias programming of bias current generator 217 that supplies bias current to the amplifier cores 205 and 207. The bias current may be adjusted as explained further herein. The voltage reference generator 219 provides voltage used to charge the capacitors in the sampling circuit 211 and functions as a charging circuit during refresh. The voltage reference generator may be implemented as a voltage digital to analog converter (VDAC).

Figure 3:
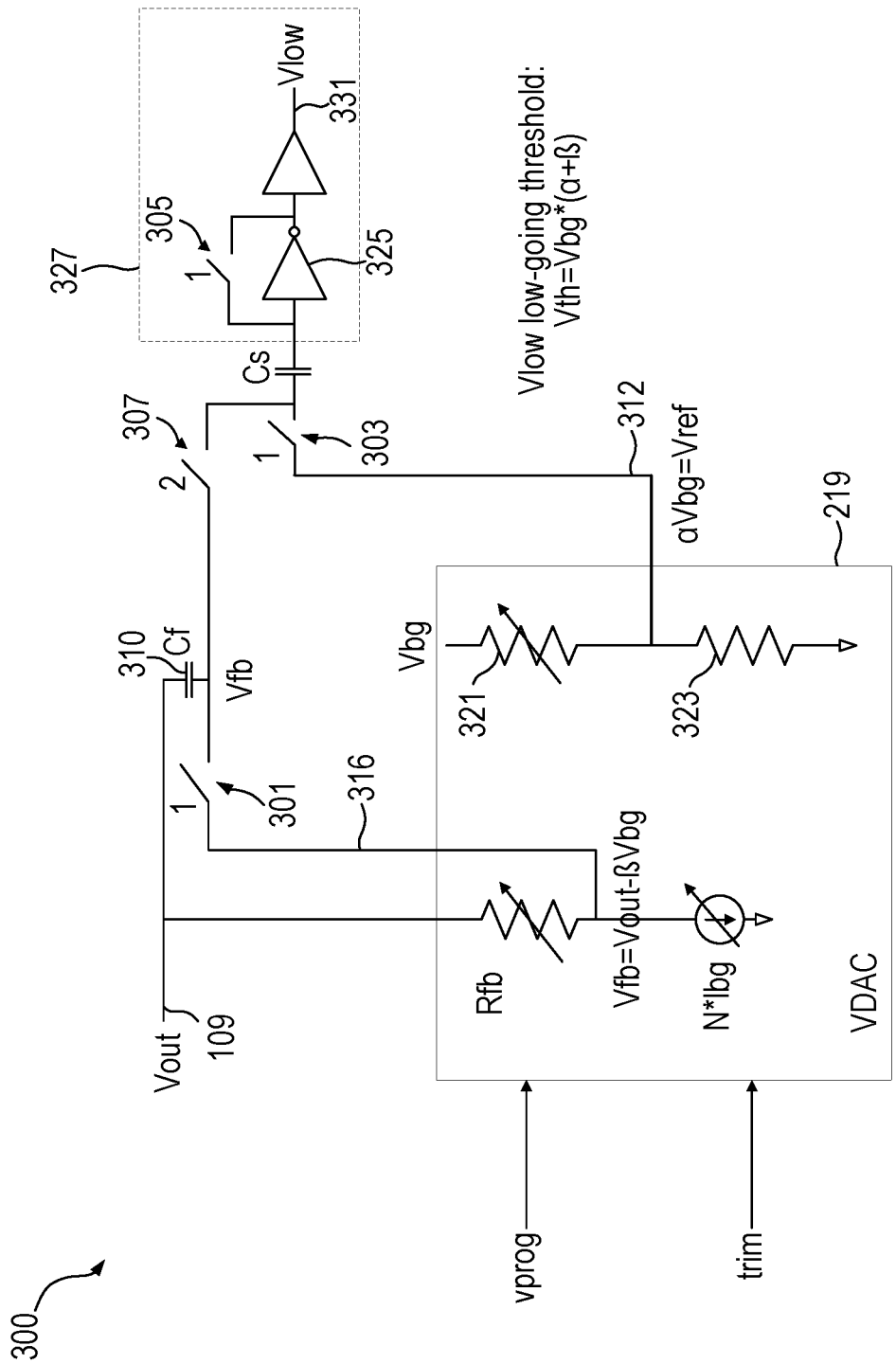
FIG. 3 illustrates an embodiment of one of the comparator cores.

FIG. 3 illustrates an embodiment of one of the comparator cores 300. During the refresh cycle the phase 1 switches 301, 303, and 305 are closed and the phase 2 switch 307 is open. During phase 1, the capacitor Cf 310 stores a scaled version of the output voltage (Vout) 109. With switch 301 closed the capacitor Cf 310 stores the voltage Vout−Vfb=βVbg, where β is a scale factor based on the programmable resistance Rfb and the programmable current source N*Ibg. A bandgap voltage Vbg can be used in generating the current N*Ibg. The current N*Ibg through the resistor Rfb creates the voltage Vfb 316 that is subtracted from Vout.

The comparator offset is autozeroed by feeding back the offset during the refresh period onto a capacitor node in series with the comparator input. During phase 1 one node of capacitor Cs is coupled to Vref. Vref is a programmable voltage divided bandgap voltage Vbg. The resistors 321 and 323 set the voltage divider value resulting in Vref=aVbg, where a is determined by the voltage divider value. The amplifier 327, with two stages shown, feeds back a value from the first stage through switch 305 creating an offset voltage Vos at the input to the amplifier. The voltage developed across the capacitor Cs during phase 1 becomes Vref−Vos. The offset voltage is thus canceled during phase 2 when switch 307 is closed and to the Vout input, the comparator appears to have zero offset.

Once the capacitors are charged to the desired voltage values, the comparator core can be utilized to monitor the voltage regulator output in phase 2 by opening switches 301, 303, and 305 and closing switch 307. Closing switch 307 causes capacitor Cf to be in series with capacitor Cs and the scaled output voltage is supplied to the comparator core stage 325 input. When switch 307 closes, the threshold voltage that determines when the comparator core 300 asserts Vlow 331 is Vbg(α+β). If the output voltage falls below Vbg(α+β), the comparator 300 asserts Vlow 331.

Figure 4:
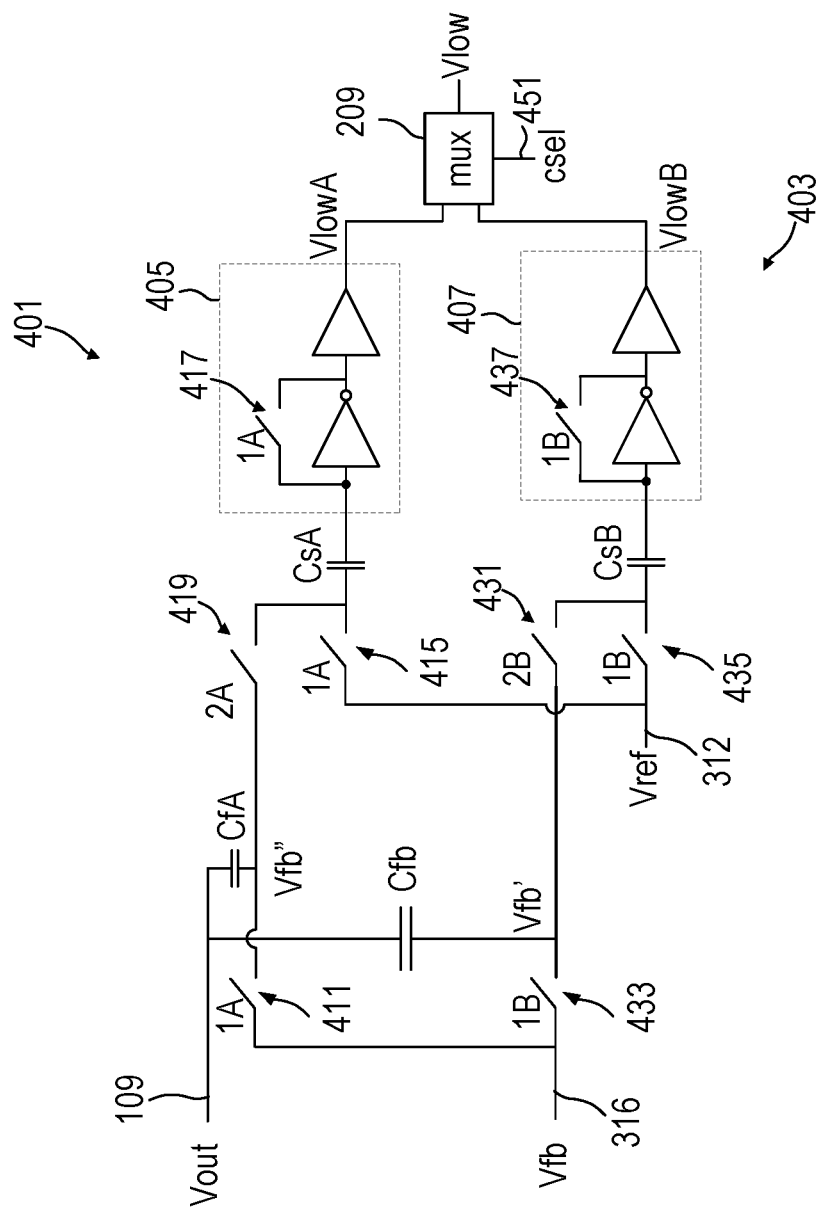
FIG. 4 illustrates an embodiment of a comparator utilizing two cores in a ping-pong fashion.

FIG. 4 illustrates one embodiment of the voltage comparator 111 in which two cores 401 and 403 are used in a ping-pong fashion. Core A 401 includes amplifier 405 and core B 405 includes amplifier 407. Each of the cores 401 and 403 operate in a manner shown and described for comparator core 300 in FIG. 3. When core B 403 is active, core A 401 is powered down or in refresh. During the refresh phase for core A 401, the switch signal 1A asserts to close switches 411, 415, and 417 and switch signal 2A is deasserted to keep switch 419 open. That allows capacitors CfA and CsA to be charged to the desired voltage levels. While core 401 is being refreshed, core 403 monitors Vout with switch signal 2B asserted closing switch 431 (phase 2B) and switches 433, 435 and 437 are open. In FIG. 4, Vout 109 is the output of the voltage converter being monitored. The generation of Vfb 316 and Vref 312 is explained above in relation to FIG. 3. The selector circuit 209 selects between the outputs VlowA and VlowB of the two cores according to the core select signal csel 451 and supplies vlow to the buck-boost converter 103 or the switched-LDO regulator 105 according to the output of the mode comparator 107 (see FIG. 1).

Figure 5:
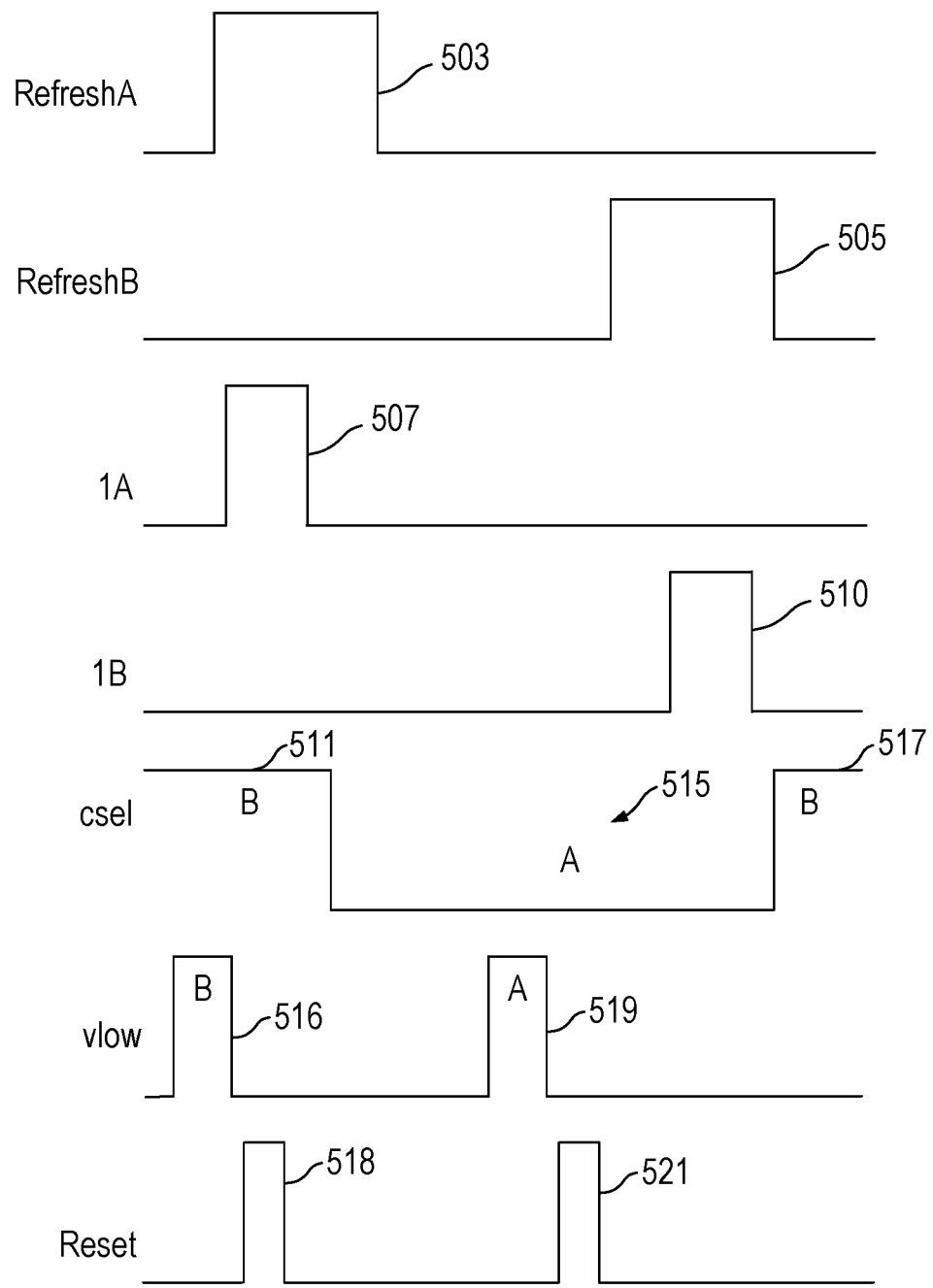
FIG. 5 illustrates an embodiment of refresh and reset timing of the two comparator cores.

FIG. 5 shows a timing diagram illustrating the alternate refresh timing of the comparator cores 401 and 403 in FIG. 4. The first refresh cycle 503 occurs on core A and the second refresh cycle 505 occurs on core B. The timing of the refresh cycle is determined by the leakage from the sampling capacitors Cf and Csa. The leakage and thus refresh timing may be affected by temperature. The refresh cycle has to occur often enough to ensure the output voltage is being accurately compared to the desired threshold stored by the sampling capacitors Cf and Cs in series while the core is active. During refresh A switch control signal 1A asserts as shown at 507. During refresh A, the core select signal csel selects core B as shown at 511. Once refresh is completed for core A, csel selects core A as the active core at 515. Core B can then be powered down while core A monitors the output voltage. Refresh begins for core B as shown at 505, resulting in the switch control signal 1B asserting at 510. Once refresh for core B is complete the core select signal csel selects core B as the active core at 517.

If the active core asserts the Vlow signal, the active core receives a reset signal from the voltage converter. After the reset is released, the output voltage should have been stepped up by the voltage converter so the output voltage should be above the threshold trigger voltage level. The reset clears the detected state from the amplifier that resulted in Vlow being asserted and gets the comparator ready to perform the next detection. In an embodiment the comparator core has multiple amplifier stages. The reset brings the output of the first stage near the threshold of the following stage. The reset also clears the previous detected state (VlowA or VlowB) and sets it again to an undetected state. Note that the reset does not affect the sampling references stored on the capacitors Cf and Cs. Thus, the active core is reset while the core is monitoring the output voltage. If the output voltage has not been stepped up sufficiently, the active core will trigger again quickly because the internal nodes are precharged to be close to the trigger point. The reset helps get the comparator ready for a new detection must faster. Thus, the assertion of Vlow at 516 by core B results in a reset signal 518 and the assertion of Vlow by core A at 519 results in the reset at 521.

While the core is not being used actively, the core is powered down except for refresh. The refresh can be accomplished in, e.g., 3 μs, and then the core can be actively used to monitor the output voltage for hundreds of milliseconds. That ensures that the current to charge the capacitors consumed in block 219 (see FIG. 3) is only utilized for a fraction of the time that the comparator core is active. When the leakage approaches a point where the sampled references stored on the capacitors are not reliable, the other core has been refreshed and can become the active core while the previously active core is powered down to save power until it needs to be powered up, refreshed, and again become the active core.

Figure 6:
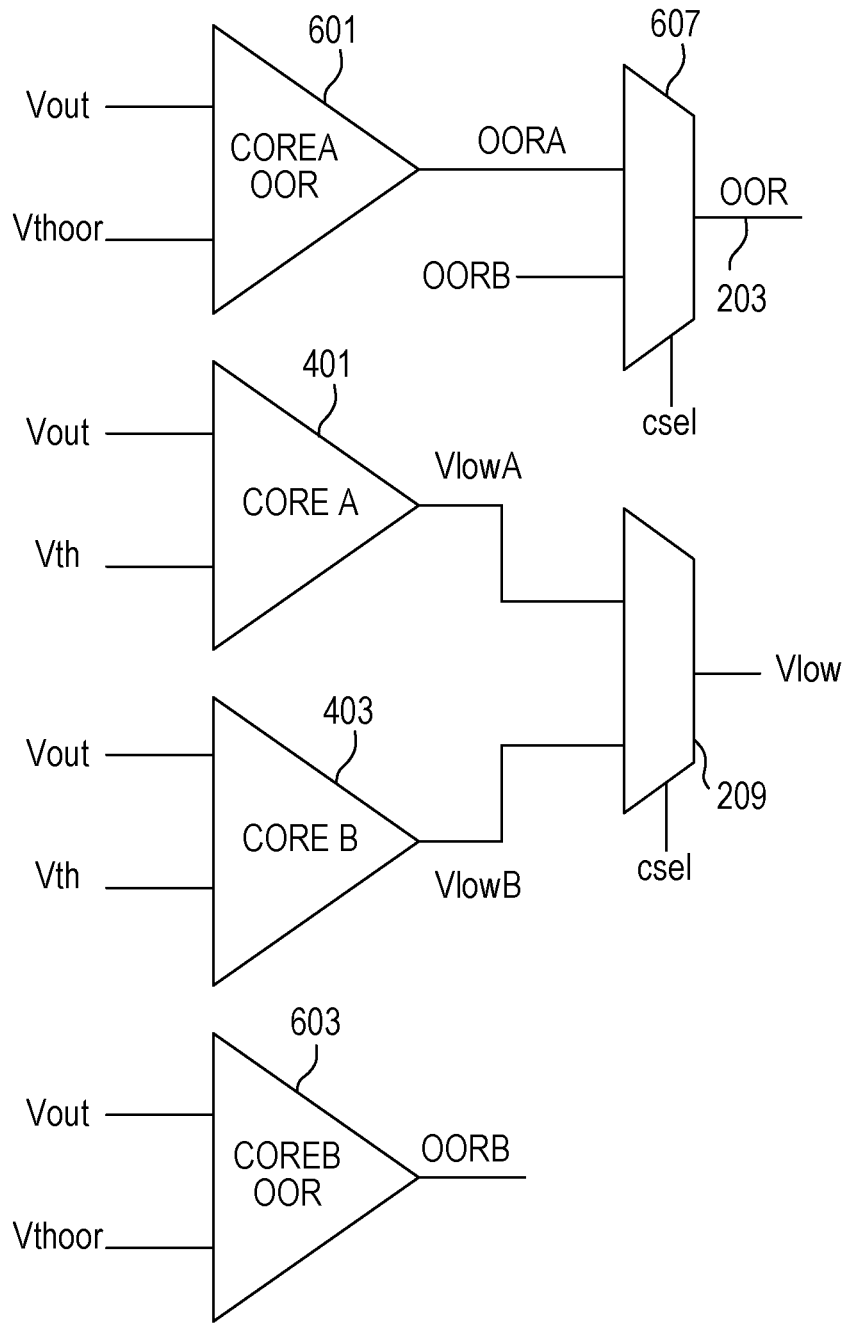
FIG. 6 illustrates comparator cores used to monitor out of range conditions.

Referring to FIG. 6, in addition to the cores 401 and 403 operating in ping-pong fashion to constantly monitor the power, embodiments may include additional comparators 601 and 603 used in a similar ping-pong fashion to monitor out of range conditions when the voltage converter output is farther from the target output voltage than typically occurs under normal loop regulation. The out of range threshold voltage (Vthoor) to compare to the voltage converter output is higher than the threshold voltage used by the control loop utilizing cores 401 and 403. Comparator 601 (COREAOOR) operates when CoreA 401 is active and comparator 603 (COREBOOR) operates when core 403 is active. Selector circuit 607 selects the OOR output from the active OOR core. The OOR cores may be constructed similar to the cores 401 and 403, an embodiment of which is shown in FIG. 3. In embodiments, the OOR cores are not reset after an out of range condition has been detected as are cores 401 and 403 after a Vlow assertion.

Figure 7:
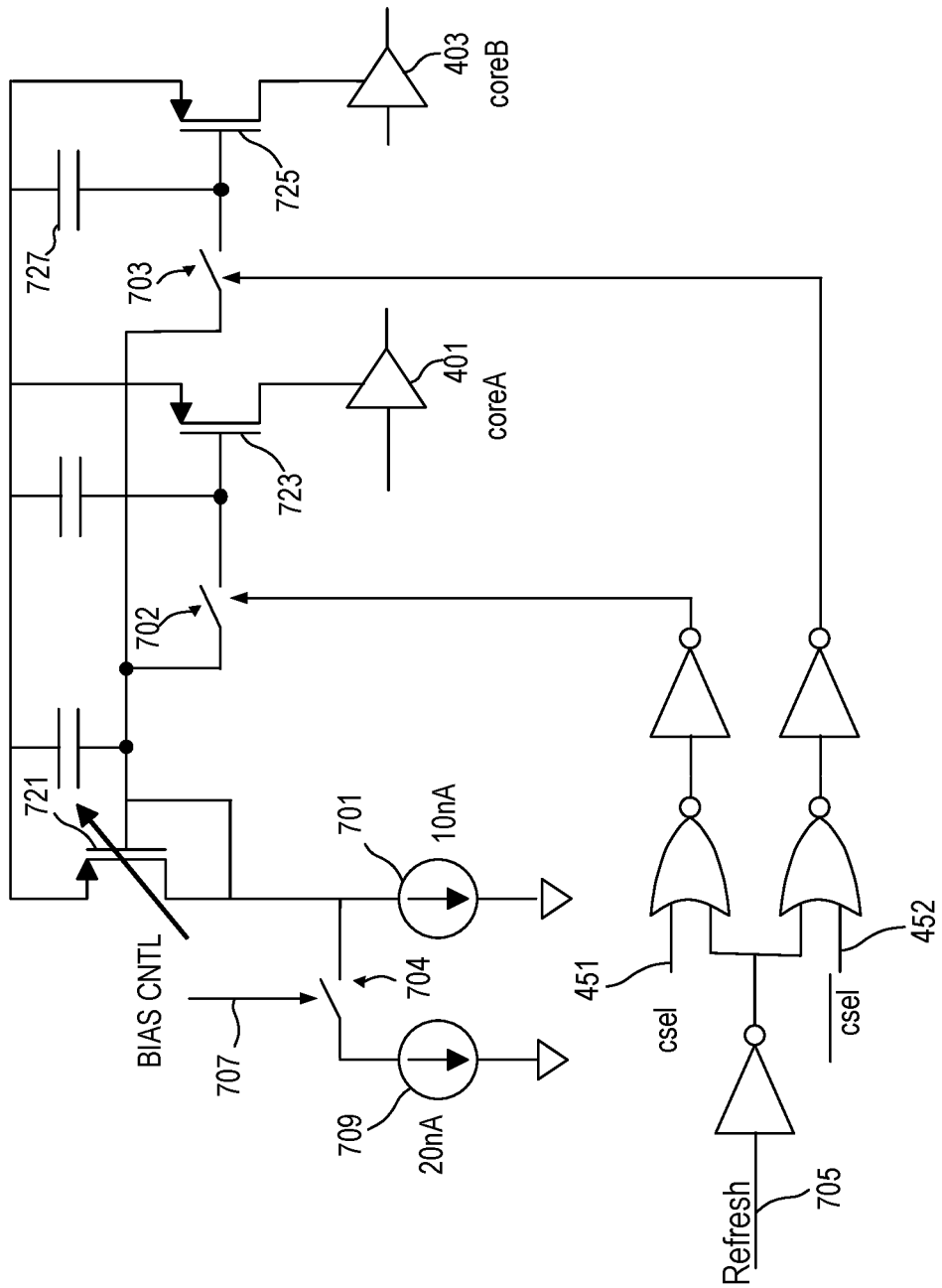
FIG. 7 illustrates an embodiment for adjusting the bias current supplied to the comparator cores.

In an embodiment, the bias current 240 (see FIG. 2) supplied to the comparator core may be changed. The comparator core utilizes a programmable bias current to trade off speed, accuracy and power consumption. Bias current may be changed during operation on the fly. During a bias change, the comparators are refreshed back-to-back and operation is not disrupted. Referring to FIG. 7 an embodiment shows that during normal operation the cores receive a 10 na bias current from current source 701 through closed switches 702 and 703. Switch 704 remains open during low power operation. The control signal refresh is at a logical low value to close switches 702 and 703 and the bias control signal 707 is at a logical low to keep switch 704 open. In an embodiment, the bias control signal 707 is the high order bit of the bias control word used to program the bias current. If the bias current is to be changed, the refresh signal 705 is asserted. The signal csel 451 (see FIG. 4) and csel 452 select the active core and open a corresponding switch 702 or 703. That ensures the active core does not get the changed bias current. Only the core in refresh receives the changed bias current. Bias current of the active comparator core is held steady by a sampled current source during the refresh cycle to prevent any threshold error associated with a bias change. For example, assume coreB 403 is the active core and coreA 401 is being refreshed with the changed bias current. The coreB 403 remains biased with the current supplied by transistor 725 as the Vgs is sampled on the capacitor 727 in parallel with the transistor 725 gate-source but is not affected by the changed bias current because switch 703 is open. FIG. 7 illustrates a current mirror formed by transistors 721, 723 and 725 supplying bias current to coreA 401 and coreB 403. The bias current depends on the W/L ratios of the transistors forming the current mirror, the sum of the current from current sources 701 and 709 (which depends on the bias control signal 707), and the remainder of the bias programming word 220 (see FIG. 2). Note that the bias currents shown are exemplary and different bias currents can be used according to the needs of a particular embodiment. The bias current may be changed, e.g., to allow the system to provide a faster response when the system expects or sees higher load currents.

When the bias current is changed, the controller may cause the comparator to enter a fast refresh in which refresh cycles are performed back-to-back. In back-to-back operation, the refreshed core becomes the active core and the previously active core is refreshed immediately without powering down the inactive core for an extended period of time as shown in FIG. 5. Once refreshed, the inactive core becomes the active core and the active core becomes the inactive core and is refreshed again without powering down for an extended period of time. That back-to-back refresh cycle repeats a number of times. The fast refresh allows the cores to adjust more quickly to the new bias current. The system may provide a fixed number, e.g., 10 to 20 fast refresh cycles when the bias current is changed. The increased bias current increases response speed with the tradeoff of also increasing power consumption.

Thus, various aspects have been described relating to an improved voltage converter. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    monitoring an output voltage using a first comparator core and a second comparator core by operating the first comparator core and the second comparator core such that when the first comparator core is monitoring the output voltage, the second comparator core is powered off or the second comparator core is being refreshed and when the second comparator core is monitoring the output voltage the first comparator core is powered off or the second comparator core is being refreshed;
    refreshing the first comparator core by causing a first sample capacitor to store a first scaled version of the output voltage and causing a first reference capacitor to store a first voltage; and
    refreshing the second comparator core by causing a second sample capacitor to store a second scaled version of the output voltage and causing a second reference capacitor to store a second voltage.

2. The method as recited in claim 1 further comprising resetting the first comparator core responsive to the first comparator core asserting a low voltage indication thereby indicating the output voltage is lower than a target voltage represented by the first scaled version of the output voltage and the first voltage in series.

3. The method as recited in claim 1, further comprising:
    storing the first scaled version by coupling a first node of the first sample capacitor to the output voltage and a second node of the first sample capacitor to a reduced version of the output voltage to thereby store the first scaled version of the output voltage across the first sample capacitor; and storing the first voltage by storing a first voltage difference between a reference voltage and a first offset voltage fed back from an amplifier stage of the first comparator core.

4. The method as recited in claim 1, further comprising:
during the refreshing of the first comparator core, opening a first switch to isolate the first sample capacitor from the first reference capacitor; and
closing the first switch to cause the first sample capacitor and the first reference capacitor to be in series when the first comparator core is monitoring the output voltage.

5. The method as recited in claim 1, further comprising:
keeping a charging circuit used during refresh powered off when refresh is not being performed.

6. The method as recited in claim 1, further comprising:
storing the first scaled version by coupling a first node of the first sample capacitor to the output voltage and a second node of the first sample capacitor to a reduced version of the output voltage to thereby store the first scaled version of the output voltage across the first sample capacitor.

7. The method as recited in claim 1 further comprising:
monitoring the output voltage for an out of range condition using a third comparator core when the first comparator core is monitoring the output voltage; and
monitoring the output voltage for the out of range condition using a fourth comparator core when the second comparator core is monitoring the output voltage.

8. The method as recited in claim 1 further comprising resetting the first comparator core responsive to the first comparator core asserting a low voltage indicator thereby indicating the output voltage is lower than a threshold voltage.

9. A method comprising:
monitoring an output voltage using a first comparator core and a second comparator core by operating the first comparator core and the second comparator core such that when the first comparator core is monitoring the output voltage, the second comparator core is powered off or the second comparator core is being refreshed and when the second comparator core is monitoring the output voltage the first comparator core is powered off or the second comparator core is being refreshed; and
adjusting a first bias current supplied to an amplifier of the first comparator core while the second comparator core is monitoring the output voltage without affecting a second bias current being supplied to the second comparator core.

10. A comparator comprising:
a first comparator core and a second comparator core;
control logic configured to maintain the first comparator core powered down or in a refresh mode to refresh the first comparator core while the second comparator core is monitoring an output voltage; and
the control logic being further configured to maintain the second comparator core powered down or in the refresh mode while the first comparator core is monitoring the output voltage;
wherein the first comparator core further includes,
a first sample capacitor to store a first scaled version of the output voltage;
a first reference capacitor to store a first voltage difference between a reference voltage and a first offset voltage fed back from an amplifier stage of the first comparator core;
a first switch to isolate the first sample capacitor from the first reference capacitor during the refresh mode;
wherein the first sample capacitor and the first reference capacitor are coupled in series through the first switch while the first comparator core is monitoring the output voltage.

11. The comparator recited in claim 10 wherein one or more amplifier stages of the first comparator core is reset responsive to the first comparator core asserting a low voltage indicator thereby indicating the output voltage is lower than a threshold voltage.

12. The comparator as recited in claim 10, wherein during refresh of the first comparator core a first node of the first sample capacitor is coupled to the output voltage and a second node of the first sample capacitor is coupled to a reduced version of the output voltage to thereby store the first scaled version of the output voltage across the first sample capacitor.

13. The comparator as recited in claim 10, further comprising:
a charging circuit used to charge the first reference capacitor and the first sample capacitor during refresh; and
wherein the charging circuit is powered off when no refresh is occurring in the comparator.

14. The comparator as recited in claim 10, further comprising
a bias current generating circuit configured to supply an adjusted first bias current to the first comparator core during refresh of the first comparator core without supplying the adjusted first bias current supplied to the second comparator core.

15. A voltage converter comprising:
a comparator to continuously monitor an output voltage of the voltage converter, the comparator including,
a first comparator core utilizing first and second switched capacitors;
a second comparator core using third and fourth switched capacitors;
wherein the first comparator core is powered down or in a refresh mode to refresh the first comparator core while the second comparator core is monitoring the output voltage; and
wherein the second comparator core is powered down or in the refresh mode to refresh the second comparator core while the first comparator core is monitoring the output voltage, the first and second switched capacitors being configured in series with an amplifier stage of the first comparator core while the first comparator core is monitoring the output voltage.

16. The voltage converter as recited in claim 15 further comprising:
wherein the first switched capacitor is isolated from the second switched capacitor while the first and second switched capacitors are being independently refreshed and the first switched capacitor is configured in series with the second switched capacitor while the first comparator core is monitoring the output voltage.

17. The voltage converter as recited in claim 15 further comprising:

a charging circuit selectively coupled to the first and second switched capacitors, the charging circuit being powered off when not being used for refresh.

18. The voltage converter as recited in claim 15 further comprising:
a fast refresh cycle in which the first and second comparator cores are refreshed back to back.

19. The voltage converter as recited in claim 15 where the third switched capacitor is configured in series with the fourth switched capacitor while the second comparator core is monitoring the output voltage.

20. The voltage converter as recited in claim 15 wherein the first comparator core is configured to assert a low voltage indication responsive to the output voltage being lower than a target voltage when the first comparator core is monitoring the output voltage, the target voltage being represented by a voltage across the first and second switched capacitors in series.

* * * * *

UNITED STATES PATENT AND TRADEMARK OFFICE
CERTIFICATE OF CORRECTION

PATENT NO. : 10,348,283 B1  
APPLICATION NO. : 15/902798  
DATED : July 9, 2019  
INVENTOR(S) : Jeffrey L. Sonntag et al.

Page 1 of 1

It is certified that error appears in the above-identified patent and that said Letters Patent is hereby corrected as shown below:

In the Claims

In Column 6, Line 48, Claim 1, please replace "second" with --first--;
In Column 7, Line 46, Claim 9, please replace "second" with --first--.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*